United States Patent [19]
Hirano

[11] Patent Number: 5,141,918
[45] Date of Patent: Aug. 25, 1992

[54] METHOD OF FORMING AN OXIDE SUPERCONDUCTING THIN FILM OF A SINGLE PHASE HAVING NO CARBONATE

[75] Inventor: Shinichi Hirano, Aichi, Japan

[73] Assignee: NGK Spark Plug Co., Ltd., Aichi, Japan

[21] Appl. No.: 664,424

[22] Filed: Mar. 4, 1991

Related U.S. Application Data

[63] Continuation-in-part of Ser. No. 341,178, Apr. 21, 1989, abandoned.

[30] Foreign Application Priority Data

Apr. 22, 1988 [JP] Japan .................. 63-100778
Apr. 25, 1988 [JP] Japan .................. 63-101927

[51] Int. Cl.⁵ .............. B05D 3/02; B05D 5/12
[52] U.S. Cl. .................... 505/1; 505/734; 427/62; 427/226; 427/126.3
[58] Field of Search .......... 505/1, 734; 427/62, 427/63, 226, 126.3

[56] References Cited

U.S. PATENT DOCUMENTS 4,959,347  9/1990  Kobayashi et al. .............. 505/1

OTHER PUBLICATIONS

Berkley et al., "In Situ Formation of Superconducting $YBa_2Cu_3O_{7-x}$ Thin Films Using Pure Ozone Vapor Oxidation", Appl. Phys. Lett. 53(20) Nov., 1988, pp. 1973-1975.

Mantese et al., "Rapid Thermal Annealing of High Tc Superconducting Thin Films Formed by Metalorganic Deposition", Appl. Phys. Lett. 52(19), May 1988, pp. 1631-1633.

Robinson et al., "Effect of Oxidizing Atmosphere on Superconductivity in $RBa_2Cu_{3-x}M_xO_z$", MRS vol. 99, Nov. 1987, pp. 587-590.

Primary Examiner—Shrive Beck
Assistant Examiner—Roy V. King
Attorney, Agent, or Firm—Sughrue, Mion, Zinn, Macpeak & Seas

[57] ABSTRACT

A method of forming an oxide superconductor thin film comprising the steps of:
(a) mixing and uniformly dissolving starting materials in a solvent to provide a uniform viscous solution having a stoichiometric composition of said oxide superconductor;
(b) coating the viscous solution onto a substrate; and
(c) rapidly heating the coated thin film in an ozone-containing oxygen gas stream.

64 Claims, 3 Drawing Sheets 5,141,918

METHOD OF FORMING AN OXIDE SUPERCONDUCTING THIN FILM OF A SINGLE PHASE HAVING NO CARBONATE

This is a continuation-in-part of the application Ser. No. 341,178 filed Apr. 21, 1989, now abandoned.

FIELD OF THE INVENTION

The present invention relates to a method of forming oxide superconductors such as a ceramic material represented by molecular formula $YBa_2Cu_3O_{7-\delta}$ ("$YBa_2Cu_3O_{7-\delta}$system" hereinafter) and a ceramic material represented by molecular formula $Bi_2Sr_2CaCu_2O_{8+\delta}$("$Bi_2Sr_2CaCu_2O_{8-\delta}$system" hereinafter).

BACKGROUND OF THE INVENTION

Oxide superconductors have comparatively high critical temperatures; (e.g., about 90 K for an oxide superconductor of the $YBa_2Cu_3O_{7-\delta}$system, and about 105 K for the $Bi_2Sr_2CaCu_2O_{8-\delta}$system). Thin films or wires of such oxide superconductors have great potential for application in the electronics and energy fields.

Thin films of superconducting oxides have principally been produced onto single-crystal substrates of oxides such as MgO and $SrTiO_3$ by vapor-phase processes including vacuum deposition and sputtering as described, e.g., in *Electronic Ceramics*, vol. 19, pages 50 to 56 (1988) (Japan). In addition to requiring a bulky and expensive apparatus, these methods are incapable of forming thin films of large area.

Recently, a method has been proposed, as described, e.g., in *Nippon Seramikkusu Kyokai Gakujutsu Ronbunshi* (Journal of the Ceramic Society of Japan), vol. 96, pages 417 to 420 (1988) and ditto, vol. 96, pages 450 to 454 (1988), in which viscous solutions of oxide superconductors such as the $YBaCu_3O_{7-\delta}$systems and the $Bi_2Sr_2CaCu_2O_{8-\delta}$systems are coated onto oxide substrates such as MgO, $ZrO_2$ (Y. doped), $SrTiO_3$ and $Al_2O_3$ by spin coating, dip coating, screen printing or some other suitable method, followed by a heat treatment to form thin films. The viscous solutions of the oxide superconductors are prepared by conditioning uniform solutions having organometallic compounds and various salts of metals mixed and dissolved in suitable solvents. This approach is can be used to form thin films of oxide superconductors since not only it obviates the need to employ a bulky and expensive apparatus but it is also capable of easily forming thin films of large area.

However, the thin films formed by heating the coatings of the viscous solutions described above contain not only high-temperature superconducting phases having high critical temperatures (e.g., $YBa_2Cu_3O_{7-\delta}$ and $Bi_2Sr_2CaCu_2O_{8+\delta}$), but also other phases such as those of the carbonates of starting metals (e.g., $BaCO_3$ in the case of the $YBa_2Cu_3O_{7-\delta}$system, and $SrCO_3$, $CaCO_3$ and a low-temperature superconducting phase having a critical temperature of 85 K in the case of the $Bi_2Sr_2CaCu_2O_{8+\delta}$system). It has thus been impossible to produce a single phase superconducting thin film at a low processing temperature with consistent and reproducible results. This has been an obstacle to the efforts to commercialize the production and use of thin films of superconducting oxides.

Heating to temperatures of 750° C. or higher is necessary to decompose carbonates such as $BaCO_3$, $SrCO_3$ and $CaCO_3$. However, at such high temperatures, a reaction occurs between the substrate and the thin film of the superconducting oxide by interdiffusion, producing a boundary layer that differs in nature from either component. Furthermore, an oxygen deficiency results or difficulty is encountered in controlling the amount of oxygen. Thus, the superconducting characteristics (e.g., critical temperature and critical current density) of the thin film deteriorate due to such high temperature processing. Other disadvantages are associated with high-volume production and most notable is the inability to form thin films of uniform thickness. Therefore, one of the major problems in producing superconducting thin films by the solution process has been how to prevent the formation of carbonate salts.

SUMMARY OF THE INVENTION

Accordingly, an object of the present invention is to provide a method to provide a high-performance high-temperature oxide superconductor substantially composed of a single phase (i.e., without any carbonate) in an easy and economical way.

Other objects and effects of the present invention will be apparent from the following description.

In order to attain the above objects, the present inventors have conducted extensive studies and have found that when a coated thin film is subjected to a rapid heat treatment in an ozone-containing oxygen gas stream, a single-phase high-temperature oxide superconductor is formed without generation of carbonates. The present invention is based on this finding.

Stated generally, the present invention relates to a method of forming an oxide superconductor thin film comprising the steps of:

(a) mixing and uniformly dissolving starting materials in a solvent to provide a uniform viscous solution having a stoichiometric composition of the oxide superconductor (b) coating the viscous solution onto a substrate; and (c) rapidly heating the coated thin film in an ozone-containing oxygen gas stream.

DETAILED DESCRIPTION OF THE INVENTION

Figure 1:
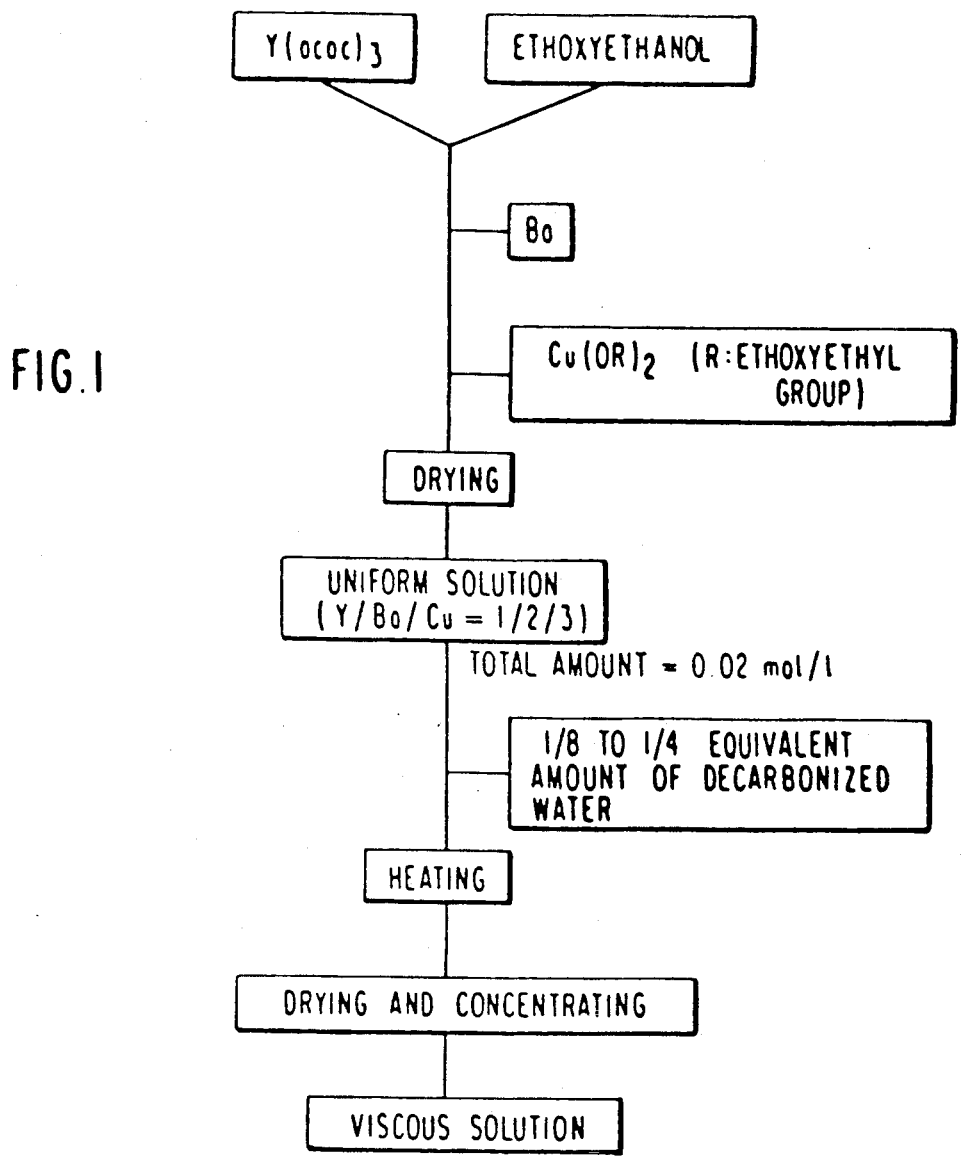
FIG. 1 is a process diagram for the production of a thin $YBa_2Cu_3O_{7-\delta}$film up to the stage of forming the viscous solution according to a first embodiment of the present invention.

Illustrative oxide superconductors that can be formed by the method of the present invention include the $YBa_2Cu_3O_{7-\delta}$ system and the $Bi_2Sr_2CaCu_2O+\delta$ system. However, these are not limiting examples, and the concept of the present invention can be applied to the formation of various other superconductors produced by the solution process as described, e.g., in *Nippon Seramikkusu Kyokai Gakujutsu Ronbunshi* (Journal of the Ceramic Society of Japan), vol. 96, pages 417 to 420 (1988) and ditto, vol. 96, pages 450 to 454 (1988).

Preferred embodiments of the present invention are described below:

(1) A method of forming an oxide superconductor thin film of the $YBa_2Cu_3O_{7-\delta}$ system, which comprises the steps of: mixing and uniformly dissolving metals and organometallic compounds containing yttrium, barium and copper in a solvent to provide a uniform viscous solution having a stoichiometric composition of the oxide superconductor; coating the viscous solution onto a substrate; and rapidly heating the coated thin film in an ozone-containing oxygen gas stream;

(2) A method as recited under item (1) above wherein the viscous solution is prepared using yttrium acetylacetonate, metallic barium and a copper alkoxide as starting materials, and the solvent is ethoxyethanol.

(3) A method of forming an oxide superconductor thin film of the $Bi_2Sr_2CaCu_2O_{8-\delta}$ system, which comprises the steps of: thermally dehydrating nitrates or chlorides of bismuth, strontium and calcium, and a copper compound used as starting materials; mixing and uniformly dissolving the dehydrated starting materials in a solvent to provide a uniform viscous solution having a stoichiometric composition of the oxide superconductor; coating the viscous solution onto a substrate; and rapidly heating the coated thin film in an ozone-containing oxygen gas stream.

(4) A method as cited under item (3) above, wherein the copper compound is copper nitrate or copper chloride.

(5) A method as cited under item (3) above, wherein the copper compound is a copper chloride.

(6) A method as recited under items (1) to (5) above wherein less than (preferably from ⅛ to ¼ of) an equivalent amount of water is added to the uniform solution to cause partial hydrolysis.

It is not completely understood why rapid heating in ozone gas prevents the formation of carbonates such as $BaCO_3$, $SrCO_3$ and $CaCO_3$. However, it is believed that the strong reaction activity of ozone combines with the rapid heating to facilitate cleavage of metal-oxygen-carbon bonds such that the $CO_2$ generated upon cleavage is quickly removed from the heating furnace with the aid of the ozone stream.

The method for coating the viscous solution is not particularly limited, and any of conventional method can be employed. Examples thereof include spin coating, dip coating and spray coating.

Ozone may be generated by conventional methods, e.g., silent electrical discharge or irradiating oxygen with ultraviolet rays or ultrasonic waves.

The amount of ozone will vary depending on the type of superconducting oxide to be produced and the film thickness thereof. A significant effect will be attained if ozone is added in an amount of about 500 ppm or more by weight, more preferably 2,000 ppm or more by weight, based on the amount of the mixed gas.

Specific conditions for ozone treatment vary with the thickness of film to be obtained, but total periods of from 0.5 to 3 hours are generally appropriate. The ozone-containing oxygen gas is preferably supplied at a flow rate of from 0.5 to 3.0 l/min.

Preferred embodiment of conditions for ozone treatment is that: (a) the coated film is rapidly heated (calcining) to a temperature of from 500 to 860.C for from 5 to 15 minutes, more preferably about 10 minutes; and then (b) the coated film is rapidly heated (sintering) to a temperature of from 800° to 900° C. for 10 to 20 minutes, more preferably about 15 minutes.

The thickness of the thin film obtained by one coating is uniform and is such that after calcining it is 1 μm or less, preferably from 0.1 to 1.0 μm, more preferably from 0.2 to 0.5 μm.

The coating and calcining steps are repeated in turn more than once in order to increase the uniform thickness of the thin film. The number of times the coating and calcining steps are repeated is not particularly limited and may be increased to obtain a resulting superconductive thin film having a larger thickness. For example, when the thickness of a resulting thin film is 3 μm, the number of repetitions may have been 15 times; when it is 10 μm, the number of repetitions may have been 50 times; and when it is 100 μm, the number of repetitions may have been 500 times.

Finally, the coated thin film is preferably annealed at an annealing temperature of from 450° to 550° C. which is maintained for 24 hours.

As the substrate, any conventional material may be used, such as $Al_2O_3$, MgO and $SrTiO_3$.

Ozone gas, which prevents the generation of carbonate salts such as $BaCO_3$, $SrCO_3$ and $CaCO_3$ upon rapid heating, also prevents oxygen deficiency in oxide superconductors when the annealing step is conducted in the presence of ozone through its active diffusing effect.

The following non-limiting examples are provided for the purpose of further illustrating the present invention.

EXAMPLE 1

Starting materials, i.e., yttrium acetylacetonate $(Y(acac)_3)$, metallic barium (Ba), and a copper alkoxide $(Cu(OR)_2$ where R is ethoxyethyl or ethoxymethyl), were provided in predetermined amounts. First, yttrium acetylacetonate was mixed and dissolved in an organic solvent (ethoxyethanol). Subsequently, metallic barium and copper alkoxide were successively mixed and dissolved in the solution to provide a stoichiometric composition having a Y/Ba/Cu molar ratio of 1/2/3. The resulting solution was dried by heating at from 40° to 50° C. in a dry $N_2$ atmosphere. Decarbonized water was then added to the dried mixture in a ¼ equivalent amount causing partial hydrolysis. The partial hydrolyzate was heated at 80° C. and concentrated by vacuum drying to form a uniform viscous solution. The process up to this stage is shown in FIG. 1.

If the solution is hydrolyzed with the equivalent ratio of $H_2O$ to the solution being adjusted to 1/1, tetragonal $YBa_2Cu_3O_{7-\delta}$ and $Y_2BaCuO_5$ are formed. The present inventors have determined that a single-phase oxide superconductor is obtained only when the solution is partially hydrolyzed under the conditions set forth above. Furthermore, rhombic $YBa_2Cu_3O_{7-\delta}$ is obtained by subsequent annealing at 550° C.

The above obtained viscous solution was coated onto a substrate of highly pure alumina (20×20 mm) by dip coating, and then dried at 150° C. The substrate having a coated film was placed in a quartz-made cylindrical electric furnace (50 mm diameter × 1,000 mm length)

heated to from 500° to 600° C. while introducing an ozone containing oxygen gas having an ozone content of 2,000 ppm at a flow rate of 2 l/min. and maintained in the furnace for 10 minutes, so as to accomplish rapid heating (for calcining).

The above procedures including dip coating, drying and rapid heating were repeated for 20 times to obtain a thin film having a thickness of about .5 $\mu$m.

The thus obtained thin film was placed in the electric furnace same as above heated to from 800° to 900° C. while introducing an ozone containing oxygen gas having an ozone content of 2,000 ppm at a flow rate of 2 l/min, and maintained in the furnace for 15 minutes, so as to accomplish rapid heating (for sintering).

The furnace temperature was then decreased at an anealing rate of 200° C./min to an anealing temperature of from 450° to 500° C., and maintained at the anealing temperature for 24 hours to effect annealing, and then the substrate having thereon the thin film was taken out of the furnace.

Figure 2:
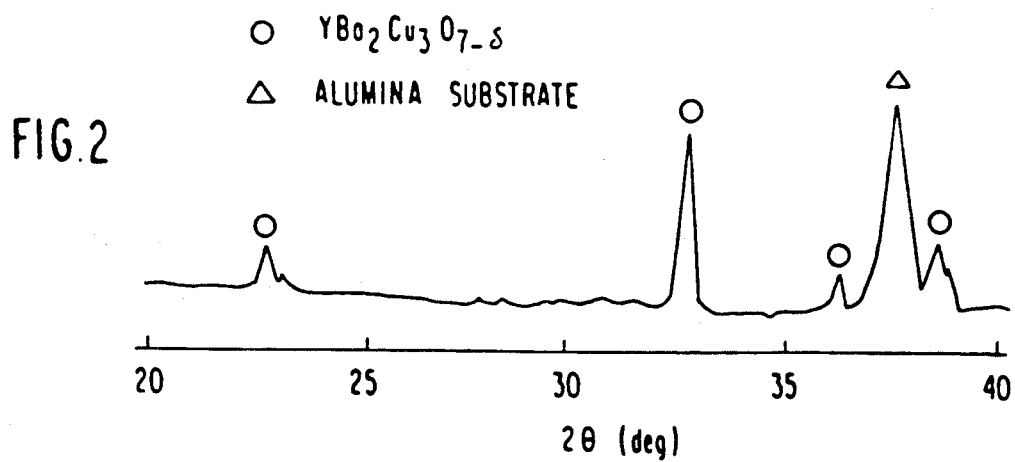
FIG. 2 is an X-ray diffraction scan of a thin $YBa_2Cu_3O_{7-\delta}$film produced according to the method of the present invention.

A X-ray diffraction scan of the thin film thus prepared is shown in FIG. 2, which shows that this film is composed solely of a single phase of $YBa_2Cu_3O_{7-\delta}$ in the absence of $BaCO_3$.

Figure 3:
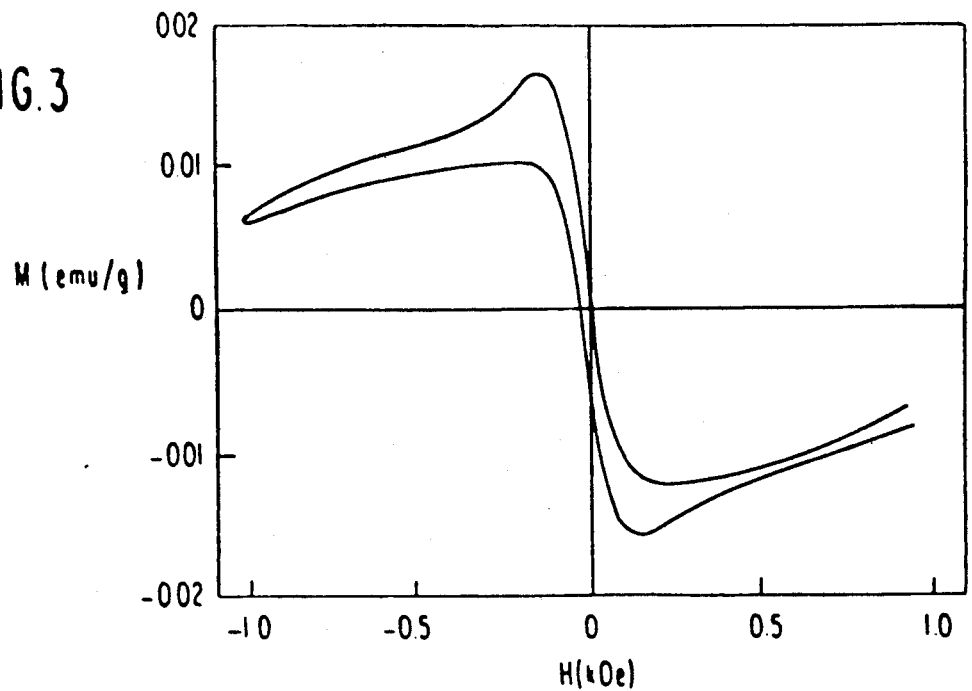
FIG. 3 is a diagram showing the magnetic characteristics of a thin $YBa_2Cu_3O_{7-\delta}$film produced according to the method of the present invention.

When the resistance vs. temperature characteristics of this film were measured by the dc four-terminal method, the temperature at which the transition to the superconducting state occurred ($Tc_{on}$) was 90 K, and temperature at which the resistance became zero ($Tc_{end}$) was 85 K. At this critical temperature, the film had a magnetization curve as shown in FIG. 3 and exhibited pronounced diamagnetism. Based on these measurements, the thin film thus produced is considered to be a high-temperature superconductor.

Equivalent results were obtained by substituting copper alkoxide with copper acetylacetonate.

EXAMPLE 2

Figure 4:
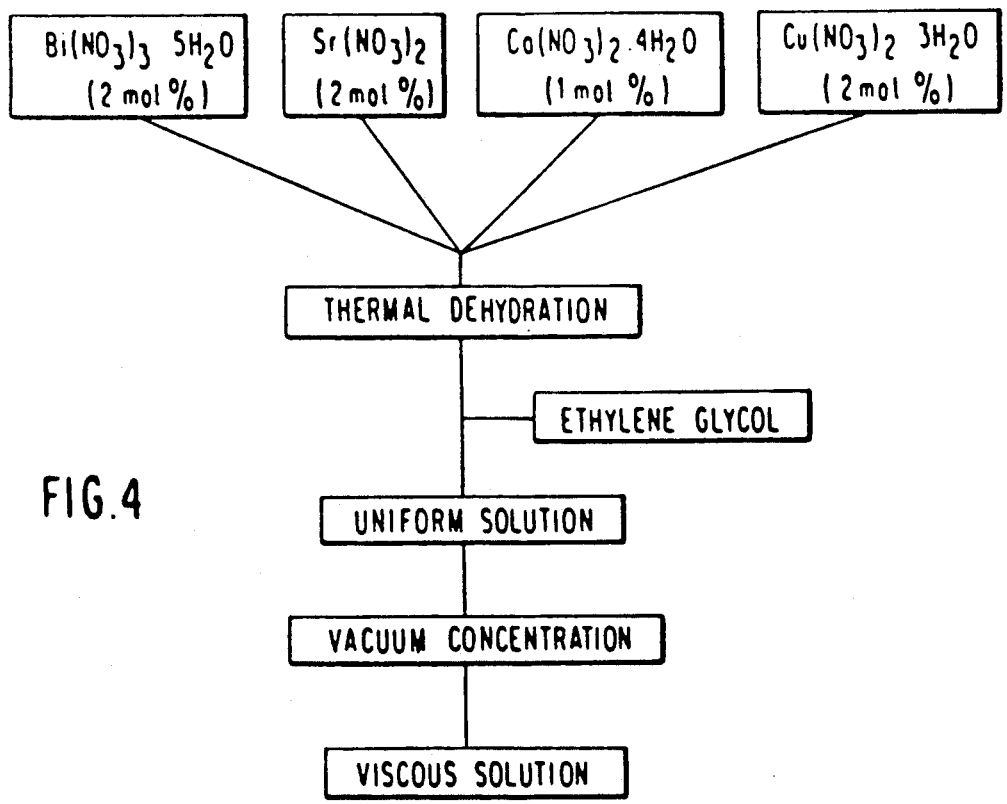
FIG. 4 is a process diagram for the production of a thin $Bi_2Sr_2CaCu_2O_{8+\delta}$film up to the stage of forming the viscous solution according to a second embodiment of the present invention.

Starting materials, i.e., bismuth nitrate pentahydrate $(Bi(NO_3)_3.5H_2O)$, strontium nitrate $(Sr(NO_3)_2)$, calcium nitrate tetrahydrate $(Ca(NO_3)_2.4H_2O)$ and copper nitrate trihydrate $(Cu(NO_3)_2.3H_2O)$, were weighed to provide a Bi/Sr/Ca/Cu molar ratio of 2/2/1/2. The respective materials were mixed and thermally dehydrated. The dehydrated product was mixed and dissolved in an organic solvent (ethylene glycol) and concentrated by vacuum drying to form a uniform viscous solution. The steps up to this stage of the process are shown in FIG. 4.

The above obtained viscous solution was coated onto a substrate of highly pure alumina (20×20 mm) by dip coating, and then dried at 150° C. The substrate having a coated film was placed in a quartz-made cylindrical electric furnace (50 mm diameter×1,000 mm length) heated to from 800° to 860° C. while introducing an ozone containing oxygen gas having an ozone content of 2,000 ppm at a flow rate of 2 l/min, and maintained in the furnace for 10 minutes, so as to accomplish rapid heating (for calcining).

The above procedures including dip coating, drying and rapid heating were repeated for 15 times to obtain a thin film having a thickness of about 3 $\mu$m.

The thus obtained thin film was placed in the electric furnace same as above heated to from 800° to 900° C. while introducing an ozone containing oxygen gas having an ozone content of 2,000 ppm at a flow rate of 2 l/min, and maintained in the furnace for 15 minutes, so as to accomplish rapid heating (for sintering).

The furnace temperature was then decreased at an annealing rate of 200° C./min to an anealing temperature of from 450° to 500° C., and maintained at the annealing temperature for 24 hours to effect anealing, and then the substrate having thereon the thin film was taken out of the furnace.

Figure 6:
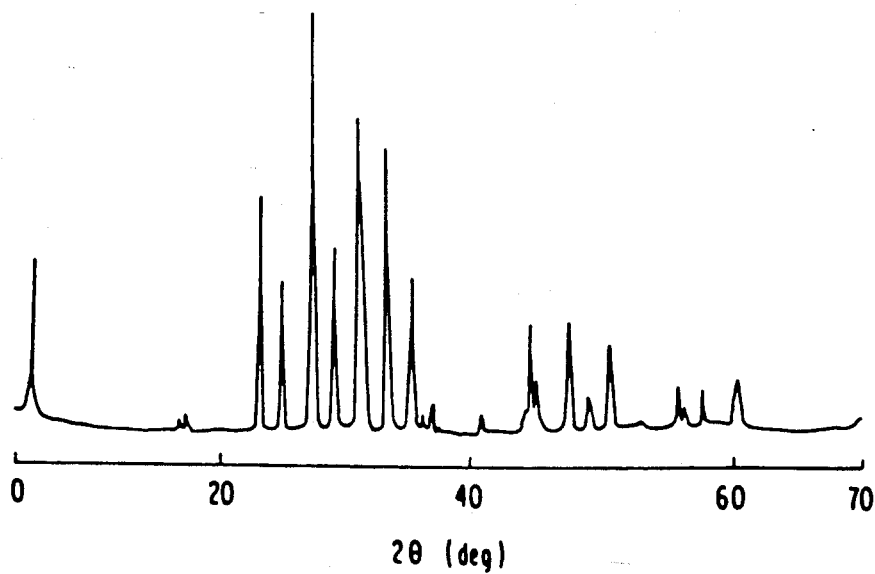
FIG. 6 is an X-ray diffraction scan of a thin $Bi_2Sr_2CaCu_2O_{8+\delta}$film produced according to the present invention.

An X-ray diffraction scan of the thin film thus prepared is given in FIG. 6, which shows that this film was predominantly composed of a high-temperature $Bi_2Sr_2CaCu_2O_{8+\delta}$ system ($T_c$ of 105 K) in the absence of $SrCO_3$ and $CaCO_3$.

When the resistance vs temperature characteristics of this film were measured by the dc four-terminal method, the transition to the superconducting state occurred at 105 K, becoming resistanceless at a temperature in the neighborhood of 85 K. Based on these measurements, the thin film thus produced is considered to be a high-temperature superconductor.

EXAMPLE 3

Figure 5:
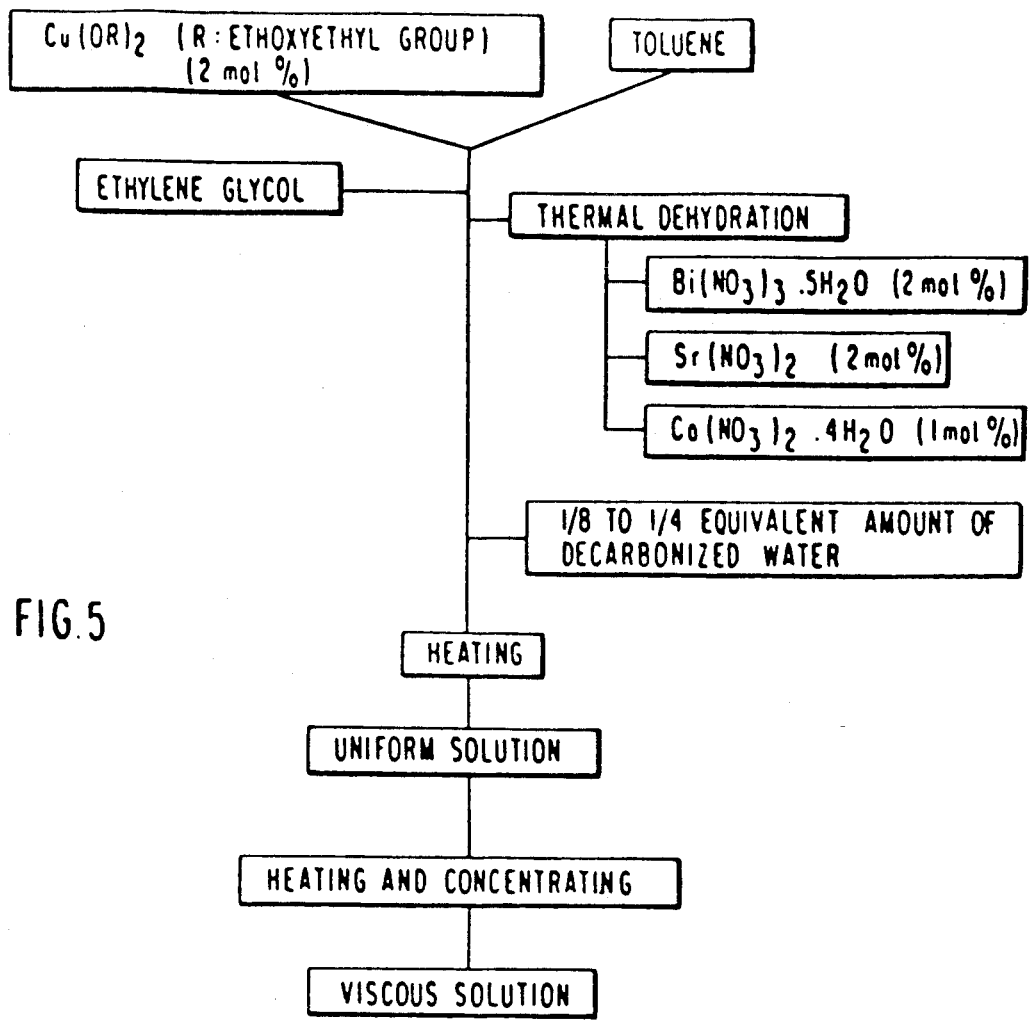
FIG. 5 is a process diagram for the production of a thin $Bi_2Sr_2CaCu_2O_{8+\delta}$film up to the stage of forming the viscous solution according to a third embodiment of the present invention.

Starting materials, i.e., bismuth nitrate pentahydrate $(Bi(NO_3)_3.5H_2O)$, strontium nitrate $(Sr(NO_3)_2)$, calcium nitrate tetrahydrate $(Ca(NO_3)_2.4H_2O)$ and a copper alkoxide $(Cu(OR)_2$ wherein R is ethoxyethyl), were provided in a Bi/Sr/Ca/Cu molar ratio of 2/2/1/2. First, the copper alkoxide was mixed and dissolved in an organic solvent (ethylene glycol). Subsequently, a dehydrated mixture of bismuth nitrate hydrate, strontium nitrate and the dried solution, decarbonized water was added in a ¼ equivalent amount to cause partial hydrolysis of the solution. The partial hydrolyzate was heated at 80° C. and concentrated by vacuum drying to form a uniform viscous solution. The steps up to this stage of the process are shown in FIG. 5.

The viscous solution was coated onto an alumina substrate and subsequently processed in the same manner as in Example 2 to produce a thin $Bi_2Sr_2CaCu_2O_{8+\delta}$ film. The X-ray diffraction scan and critical temperature of this film were substantially the same as those observed with the film produced in Example 2.

Equivalent results were obtained by replacing bismuth nitrate and calcium nitrate with $BiCl_3$ and $CaCl_2$, respectively, in both Examples 2 and 3.

In accordance with the present invention, a high-performance and high-temperature oxide superconductor substantially composed of a single phase of an oxide superconductor and having a high critical temperature is produced in an easy and economical way. Therefore, the present invention has the potential to increase the industrial applicability of high-temperature oxide superconductors.

While the invention has been described in detail and with reference to specific examples thereof, it will be apparent to one skilled in the art that various changes and modifications can be made therein without departing from the spirit and scope thereof.

What is claimed is:

1. A method of forming an oxide superconductor thin film of a single phase having no carbonate, comprising the steps of:

(a) mixing and uniformly dissolving starting materials in a solvent to provide a uniform viscous solution having a stoichiometric composition of the oxide superconductor thin film to be formed, wherein at least one of the solvent and the starting materials is an organic substance;

(b) coating a thin film of the viscous solution on a substrate such that said thin film coated on the substrate has a uniform thickness of 1 μm or less after calcining;

(c) calcining said thin film of the viscous solution in an ozone-containing oxygen gas stream having an ozone content of at least 500 ppm by weight;

(d) repeating steps (b) and (c) in turn more than once in order to increase the uniform thickness of said thin film coated and calcined on the substrate and to thereby prevent formation of carbonate in the oxide superconductor thin film; and (e) rapidly sintering the thickened and calcined thin film in the ozone-containing oxygen gas stream having an ozone content of at least 500 ppm by weight for a period of not more than 20 minutes at a temperature of more than 750° C.

2. A method as claimed in claim 1, wherein said oxide superconductor thin film to be formed is made of a copper oxide superconductor of a $YBa_2Cu_3O_{7-\delta}$ or $Bi_2Sr_2CaCu_2O_{8+\delta}$ system.

3. A method as claimed in claim 1, wherein said calcining is accompanied by rapid heating at a temperature-elevating rate of more than 50° C./minute.

4. A method as claimed in claim 2, wherein said calcining is accompanied by rapid heating at a temperature-elevating rate of more than 50° C./minute.

5. A method as claimed in claim 1, wherein said sintering is accompanied by rapid heating at a temperature-elevating rate of more than 50° C./minute.

6. A method as claimed in claim 2, wherein said sintering is accompanied by rapid heating at a temperature-elevating rate of more than 50° C./minute.

7. A method as claimed in claim 3, wherein said sintering is accompanied by rapid heating at a temperature-elevating rate of more than 50° C./minute.

8. A method as claimed in claim 4, wherein said sintering is accompanied by rapid heating at a temperature-elevating rate of more than 50° C./minute.

9. A method as claimed in claim 1, wherein said ozone content is 2,000 ppm or more by weight.

10. A method as claimed in claim 2, wherein said ozone content is 2,000 ppm or more by weight.

11. A method as claimed in claim 3, wherein said ozone content is 2,000 ppm or more by weight.

12. A method as claimed in claim 4, wherein said ozone content is 2,000 ppm or more by weight.

13. A method as claimed in claim 5, wherein said ozone content is 2,000 ppm or more by weight.

14. A method as claimed in claim 6, wherein said ozone content is 2,000 ppm or more by weight.

15. A method as claimed in claim 7, wherein said ozone content is 2,000 ppm or more by weight.

16. A method as claimed in claim 8, wherein said ozone content is 2,000 ppm or more by weight.

17. A method as claimed in claim 1, wherein said ozone-containing oxygen gas stream is supplied at a flow rate of from 0.5 to 3.0 liter/minute.

18. A method as claimed in claim 2, wherein said ozone-containing oxygen gas stream is supplied at a flow rate of from 0.5 to 3.0 liter/minute.

19. A method as claimed in claim 3, wherein said ozone-containing oxygen gas stream is supplied at a flow rate of from 0.5 to 3.0 liter/minute.

20. A method as claimed in claim 4, wherein said ozone-containing oxygen gas stream is supplied at a flow rate of from 0.5 to 3.0 liter/minute.

21. A method as claimed in claim 5, wherein said ozone-containing oxygen gas stream is supplied at a flow rate of from 0.5 to 3.0 liter/minute.

22. A method as claimed in claim 6, wherein said ozone-containing oxygen gas stream is supplied at a flow rate of from 0.5 to 3.0 liter/minute.

23. A method as claimed in claim 7, wherein said ozone-containing oxygen gas stream is supplied at a flow rate of from 0.5 to 3.0 liter/minute.

24. A method as claimed in claim 8, wherein said ozone-containing oxygen gas stream is supplied at a flow rate of from 0.5 to 3.0 liter/minute.

25. A method as claimed in claim 9, wherein said ozone-containing oxygen gas stream is supplied at a flow rate of from 0.5 to 3.0 liter/minute.

26. A method as claimed in claim 10, wherein said ozone-containing oxygen gas stream is supplied at a flow rate of from 0.5 to 3.0 liter/minute.

27. A method as claimed in claim 11, wherein said ozone-containing oxygen gas stream is supplied at a flow rate of from 0.5 to 3.0 liter/minute.

28. A method as claimed in claim 12, wherein said ozone-containing oxygen gas stream is supplied at a flow rate of from 0.5 to 3.0 liter/minute.

29. A method as claimed in claim 13, wherein said ozone-containing oxygen gas stream is supplied at a flow rate of from 0.5 to 3.0 liter/minute.

30. A method as claimed in claim 14, wherein said ozone-containing oxygen gas stream is supplied at a flow rate of from 0.5 to 3.0 liter/minute.

31. A method as claimed in claim 15, wherein said ozone-containing oxygen gas stream is supplied at a flow rate of from 0.5 to 3.0 liter/minute.

32. A method as claimed in claim 16, wherein said ozone-containing oxygen gas stream is supplied at a flow rate of from 0.5 to 3.0 liter/minute.

33. A method as claimed in claim 1, wherein the calcining temperature is between 500° and 800° C.

34. A method as claimed in claim 2, wherein the calcining temperature is between 500° and 800° C.

35. A method as claimed in claim 3, wherein the calcining temperature is between 500° and 800° C.

36. A method as claimed in claim 4, wherein the calcining temperature is between 500° and 800° C.

37. A method as claimed in claim 5, wherein the calcining temperature is between 500° and 800° C.

38. A method as claimed in claim 6, wherein the calcining temperature is between 500° and 800° C.

39. A method as claimed in claim 7, wherein the calcining temperature is between 500° and 800° C.

40. A method as claimed in claim 8, wherein the calcining temperature is between 500° and 800° C.

41. A method as claimed in claim 9, wherein the calcining temperature is between 500° and 800° C.

42. A method as claimed in claim 10, wherein the calcining temperature is between 500° and 800° C.

43. A method as claimed in claim 11, wherein the calcining temperature is between 500° and 800° C.

44. A method as claimed in claim 12, wherein the calcining temperature is between 500° and 800° C.

45. A method as claimed in claim 13, wherein the calcining temperature is between 500° and 800° C.

46. A method as claimed in claim 14, wherein the calcining temperature is between 500° and 800° C.

47. A method as claimed in claim 15, wherein the calcining temperature is between 500° and 800° C.

48. A method as claimed in claim 16, wherein the calcining temperature is between 500° and 800° C.

49. A method as claimed in claim 17, wherein the calcining temperature is between 500° and 800° C.

50. A method as claimed in claim 18, wherein the calcining temperature is between 500° and 800° C.

51. A method as claimed in claim 19, wherein the calcining temperature is between 500° and 800° C.

52. A method as claimed in claim 20, wherein the calcining temperature is between 500° and 800° C.

53. A method as claimed in claim 21, wherein the calcining temperature is between 500° and 800° C.

54. A method as claimed in claim 22, wherein the calcining temperature is between 500° and 800° C.

55. A method as claimed in claim 23, wherein the calcining temperature is between 500° and 800° C.

56. A method as claimed in claim 24, wherein the calcining temperature is between 500° and 800° C.

57. A method as claimed in claim 25, wherein the calcining temperature is between 500° and 800° C.

58. A method as claimed in claim 26, wherein the calcining temperature is between 500° and 800° C.

59. A method as claimed in claim 27, wherein the calcining temperature is between 500° and 800° C.

60. A method as claimed in claim 28, wherein the calcining temperature is between 500° and 800° C.

61. A method as claimed in claim 29, wherein the calcining temperature is between 500° and 800° C.

62. A method as claimed in claim 30, wherein the calcining temperature is between 500° and 800° C.

63. A method as claimed in claim 31, wherein the calcining temperature is between 500° and 800° C.

64. A method as claimed in claim 32, wherein the calcining temperature is between 500° and 800° C.

* * * * *